United States Patent
Chen

(10) Patent No.: US 8,415,719 B2
(45) Date of Patent: Apr. 9, 2013

(54) LOW GATE CHARGING RECTIFIER HAVING MOS STRUCTURE AND P-N JUNCTION, AND MANUFACTURING METHOD OF THE SAME

(76) Inventor: Tzu-Hsiung Chen, Taipei (TW)

( * ) Notice: Subject to any disclaimer, the term of this patent is extended or adjusted under 35 U.S.C. 154(b) by 0 days.

(21) Appl. No.: 13/177,727

(22) Filed: Jul. 7, 2011

(65) Prior Publication Data

US 2012/0007152 A1    Jan. 12, 2012

(30) Foreign Application Priority Data

Jul. 9, 2010  (TW) .................................. 99122707 A

(51) Int. Cl.
*H01L 27/06*    (2006.01)

(52) U.S. Cl.
USPC .......................................... 257/262; 438/109

(58) Field of Classification Search .................. 257/262, 257/E25.002, E21.358; 438/109, 134, 197, 438/199
See application file for complete search history.

(56) References Cited

U.S. PATENT DOCUMENTS

| | | | | |
|---|---|---|---|---|
| 5,430,315 A | * | 7/1995 | Rumennik | 257/331 |
| 5,731,604 A | * | 3/1998 | Kinzer | 257/153 |
| 5,879,968 A | * | 3/1999 | Kinzer | 438/135 |
| 6,022,790 A | * | 2/2000 | Wagers et al. | 438/454 |
| 6,043,126 A | * | 3/2000 | Kinzer | 438/273 |
| 6,624,030 B2 | * | 9/2003 | Chang et al. | 438/268 |
| 7,038,260 B1 | * | 5/2006 | Yu | 257/287 |
| 7,560,368 B2 | * | 7/2009 | Magri' et al. | 438/570 |
| 2010/0044796 A1 | * | 2/2010 | Hshieh | 257/365 |
| 2011/0284953 A1 | * | 11/2011 | Long et al. | 257/331 |

* cited by examiner

*Primary Examiner* — Thao Le
(74) *Attorney, Agent, or Firm* — WPAT PC; Justin King

(57) ABSTRACT

A low gate charging rectifier having a MOS structure and a P-N junction and a manufacturing method thereof are provided. The low gate charging rectifier is a combination of an N-channel MOS structure and a lateral P-N junction diode. A portion of the gate-covering region is replaced by a thicker dielectric layer or a low conductivity polysilicon layer. In a forward mode, the N-channel MOS structure and the P-N junction diode are connected with each other in parallel. Under this circumstance, like the Schottky diode, the low gate charging rectifier has low forward voltage drop and rapid switching speed. Whereas, in a reverse mode, the leakage current is pinched off and the N-channel is shut off by the depletion region of the P-N junction diode, so that the low gate charging rectifier has low leakage current.

13 Claims, 11 Drawing Sheets

LOW GATE CHARGING RECTIFIER HAVING MOS STRUCTURE AND P-N JUNCTION, AND MANUFACTURING METHOD OF THE SAME

This application claims the benefit of Taiwan Patent Application No. 99122707, filed Jul. 9, 2010, the subject matter of which is incorporated herein by reference.

FIELD OF THE INVENTION

The present invention relates to a low gate charging rectifier having a metal-oxide-semiconductor (MOS) structure and a P-N junction, and more particularly to a low gate charging rectifier with low leakage current, low forward voltage drop, high reverse voltage and fast reverse recovery time. The present invention also relates to a method for manufacturing such a low gate charging rectifier.

BACKGROUND OF THE INVENTION

A Schottky diode is a unipolar device using electrons as carriers, which is characterized by high switching speed and low forward voltage drop. The limitations of Schottky diodes are the relatively low reverse voltage tolerance and the relatively high reverse leakage current. The limitations are related to the Schottky barrier determined by the metal work function of the metal electrode, the band gap of the intrinsic semiconductor, the type and concentration of dopants in the semiconductor layer, and other factors. In contrast to the Schottky diode, a P-N junction diode is a bipolar device that can pass more current than the Schottky diode. However, the P-N junction diode has a forward voltage drop higher than that of the Schottky diode, and takes longer reverse recovery time due to a slow and random recombination of electrons and holes during the recovery period.

For combining the benefits of the Schottky diode and the P-N junction diode, a configuration of a gated diode device has been disclosed. In the gated diode, the equi-potential gate and source electrodes of a planar MOSFET are served as the anode, and the drain electrode at the backside of the wafer is served as the cathode. The gated diode device has comparable or lower forward voltage drop with respect to the Schottky diode. The reverse leakage current of the gated diode device is similar to the P-N junction diode, but is lower than the Schottky diode. The reverse recovery time at high temperature of the gated diode device is similar to the Schottky diode. The interface tolerance temperature of the gated diode device is higher than the Schottky diode. In practical applications, the gated diode device is advantageous over the Schottky diode.

A typical gated diode device has been disclosed in U.S. Pat. No. 6,624,030, which is entitled "RECTIFIER DEVICE HAVING A LATERALLY GRADED P-N JUNCTION FOR A CHANNEL REGION". Please refer to FIGS. 1A~1I, which schematically illustrate a method of manufacturing a gated diode device.

Firstly, as shown in FIG. 1A, an N+ substrate 20 with an N− epitaxial layer 22 grown thereon is provided, wherein a field oxide layer 50 is grown on the surface of the N− epitaxial layer 22. Then, as shown in FIG. 1B, a photoresist layer 52 is formed on the field oxide layer 50. A first photolithography and etching process is performed to partially remove the field oxide layer 50. Then, a first ion-implanting process is performed to dope the substrate with a P-type dopant (e.g. boron) through openings in the photoresist layer 52. Then, a boron thermal drive-in process is perform to form edge P-doped structures 28 and a center P-doped structure 30 (FIG. 1O).

Then, a second ion-implanting process is performed to dope the substrate with BF2. Then, a second photolithography and etching process is performed to use a photoresist layer 54 to cover the periphery of the device region and remove the field oxide layer 50 in the center of the device region (FIG. 1D and FIG. 1E). As shown in FIG. 1F, a gate silicon oxide layer 56, a polysilicon layer 58 and a silicon nitride layer 60 are sequentially grown, and an arsenic implantation process is made. Then, as shown in FIG. 1G, an oxide layer 62 is formed by chemical vapor deposition. Then, a third photolithography and etching process is performed to form a gate-pattern photoresist layer 64 over the oxide layer 62. Then, a wet etching process is performed to etch the oxide layer 62 while leaving the oxide layer 62 under the gate-pattern photoresist layer 64 (FIG. 1H). Then, a dry etching process is performed to partially remove the silicon nitride layer 60, and a third ion-implanting process is performed to dope the substrate with boron ion (FIG. 1I). Then, the remaining photoresist layer 64 is removed, and a fourth ion-implanting process is performed to dope the substrate with boron ion to form a P-type pocket 36 (FIG. 1J). Then, a wet etching process is performed to remove the silicon oxide layer 62, and a dry etching process is performed to partially remove the polysilicon layer 58 (FIG. 1K). Then, an arsenic implantation process is made to form an N-doped source/drain region 24, a wet etching process is performed to remove the silicon nitride layer 60, and an arsenic implantation process is made (FIG. 1L). Meanwhile, some fabricating steps of the gated diode device have been done. After subsequent steps (e.g. metallic layer formation, photolithography and etching process, and so on) are carried out, the front-end process is completed.

In comparison with the Schottky diode, the gated diode device fabricated by the above method has comparable forward voltage drop, lower reverse leakage current, higher interface tolerance temperature, better reliability result and longer reverse recovery time (at the room temperature).

SUMMARY OF THE INVENTION

Therefore, the present invention relates to a low gate charging rectifier having a metal-oxide-semiconductor (MOS) structure and a P-N junction, and a method for manufacturing such a low gate charging rectifier. The low gate charging rectifier is also named as "Hunchback Diode" by its device profile. The low gate charging rectifier is a combination of an N-channel MOS structure and a lateral P-N junction diode, wherein a portion of the gate-covering region is replaced by a thicker dielectric layer or a low conductivity polysilicon layer. In a forward mode, the N-channel MOS structure and the P-N junction diode are connected with each other in parallel. Under this circumstance, like the Schottky diode, the low gate charging rectifier has low forward voltage drop and rapid switching speed. Whereas, in a reverse mode, the leakage current is pinched off and the N-channel is shut off by the depletion region of the P-N junction diode, so that the low gate charging rectifier has low leakage current. In addition, since the ineffective gate-covering area is reduced, the parasitic capacitance will be decreased. Under this circumstance, the low gate charging rectifier has shorter reverse recovery time. Moreover, since the ineffective gate-covering area is reduced, the reverse leakage current is low. Since a thinner gate oxide layer may be used in the low gate charging rectifier, the forward voltage drop may be further reduced. As a result, the low gate charging rectifier of the present invention has the benefits of the Schottky diode and the P-N junction diode. That is, the low gate charging rectifier of the present invention has rapid switching speed, low forward voltage drop, low reverse leakage current and short reverse recovery time.

An embodiment of the present invention provides a method for manufacturing a low gate charging rectifier having a metal-oxide-semiconductor (MOS) structure and a P-N junction. Firstly, a substrate is provided. A first mask layer is formed on the substrate. A first photolithography and etching process is performed to partially remove the first mask layer to form a first concave structure in the first mask layer. A dry etching process is performed to remove the substrate uncovered by the first mask layer to form a first trench structure in the substrate. An oxidation process to grow a first oxide layer on an inner surface of the first trench structure. A second photolithography and etching process is performed to partially remove the first mask layer to form a second concave structure in the first mask layer. A gate oxide layer is grown on a bottom of the second concave structure. A polysilicon layer is formed on the gate oxide layer, the first mask layer and the first oxide layer. A first ion-implanting process is performed to dope the substrate to form a first doped region. A second mask layer is formed on the polysilicon layer. A dry etch-back process is performed to partially remove the second mask layer to form a covering structure on a sidewall of the polysilicon layer within the second concave structure and on a sidewall of the polysilicon layer within the first trench structure. An etching process is performed to partially remove the polysilicon layer to form a gate structure. A second ion-implanting process is performed to dope the substrate to form a second doped region. An annealing process is performed to activate the first doped region and the second doped region to form an effective P-type region. A wet etching process is performed to remove the covering structure of the second mask layer. An exposed portion of the gate oxide layer is removed. A metallic sputtering process is performed to form a metallic sputtering layer on a bottom and a sidewall of the first trench structure, a bottom and a sidewall of the second concave structure, a surface and a sidewall of the gate structure, the first mask layer and the first oxide layer. Afterwards, a third photolithography and etching process is performed to partially remove the metallic sputtering layer.

Another embodiment of the present invention provides a low gate charging rectifier having a metal-oxide-semiconductor (MOS) structure and a P-N junction. The low gate charging rectifier includes a substrate, a concave structure, a gate oxide layer, a gate structure, a metallic sputtering layer and plural doped regions. The concave structure is formed over the substrate. The gate oxide layer is formed at a periphery of a bottom of the concave structure. The gate structure is formed on the gate oxide layer and a sidewall of the concave structure. The metallic sputtering layer is formed on the bottom of the concave structure and the gate structure. The doped regions are formed in the substrate at different depths and arranged under the concave structure and beside the gate structure.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provide a low gate charging rectifier having a metal-oxide-semiconductor (MOS) structure and a P-N junction, and a method for manufacturing such a low gate charging rectifier. In comparison with the conventional gated diode device, the area of the gate structure covering the gate oxide layer is largely reduced, so that the parasitic capacitance is largely decreased. Under this circumstance, the low gate charging rectifier has shorter reverse recovery time and improved device performance. Moreover, since the area of the gate structure covering the gate oxide layer is largely reduced, the gate leakage current is reduced.

If the performance in leakage current is similar to the conventional gated diode device, a thinner gate oxide layer may be used in the low gate charging rectifier, so that the forward voltage drop may be further reduced. As know, four mask layers and four photolithography processes are required in the method for manufacturing the conventional gated diode device. However, since three mask layers and three photolithography processes are used, the method for manufacturing the low gate charging rectifier (Hunchback Diode) of the present invention is simplified and more cost-effective. In other words, the low gate charging rectifier (Hunchback Diode) of the present invention has improved device performance and cost competitiveness.

That is, the low gate charging rectifier of the present invention has shorter reverse recovery time, lower forward voltage drop, lower reverse leakage current, lower interface capacitance, higher interface tolerance temperature, better reliability result and better cost competitiveness. A method for manufacturing the low gate charging rectifier of the present invention will be illustrated in more details as follows.

Figure 1A:
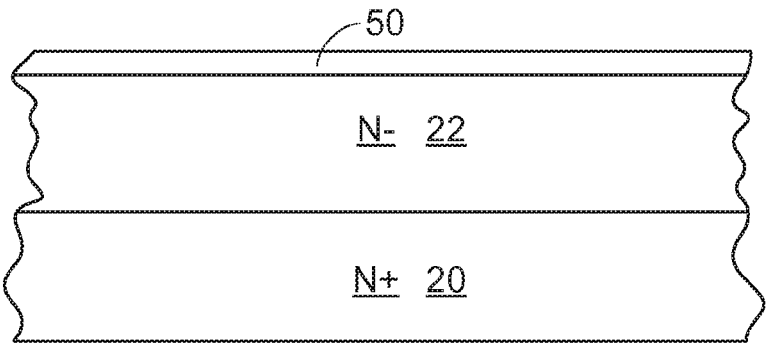
FIGS. 1A~1L (PRIOR ART) schematically illustrate a method of manufacturing a gated diode device according to the prior art.
Figure 1B:
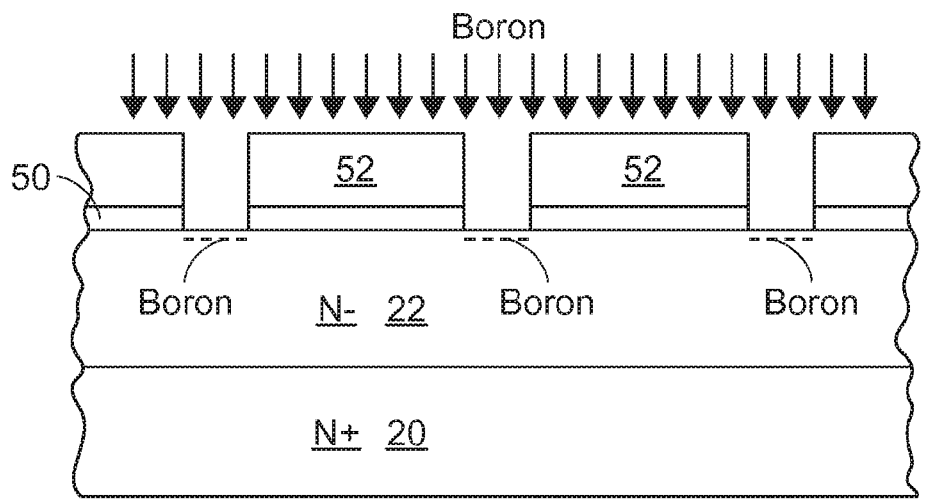
Figure 1C:
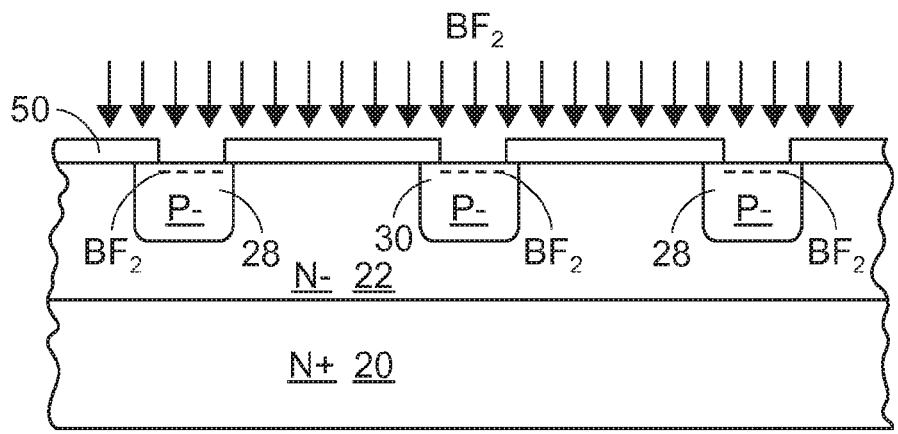
Figure 1D:
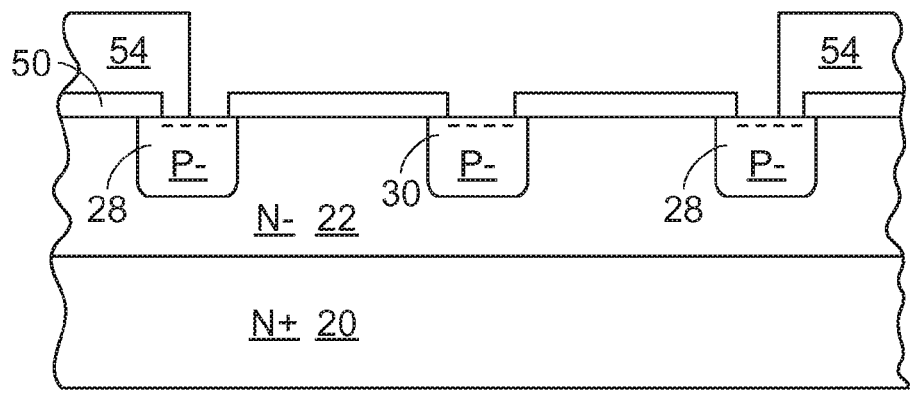
Figure 1E:
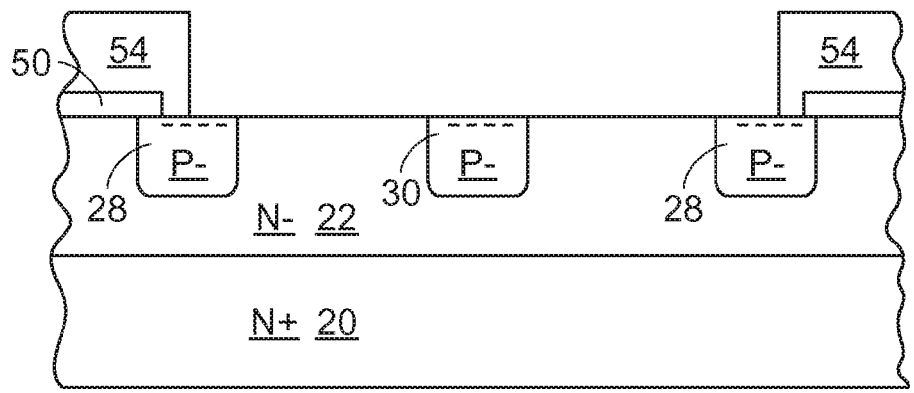
Figure 1F:
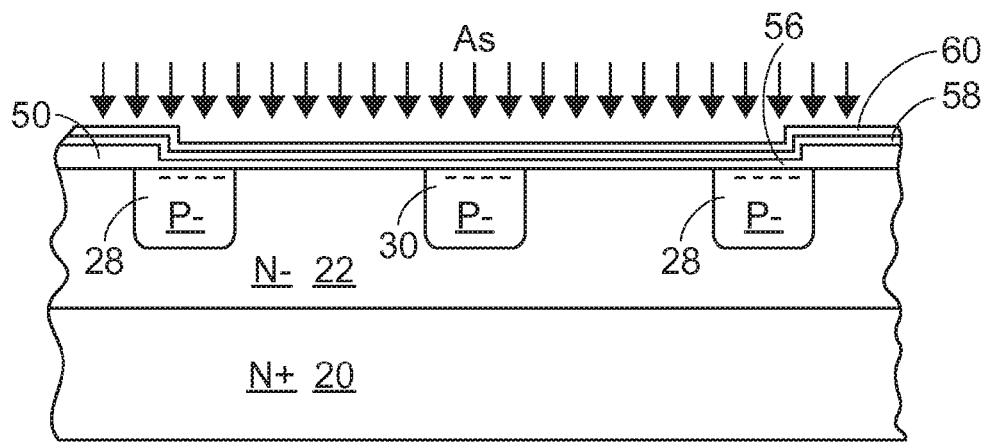
Figure 1G:
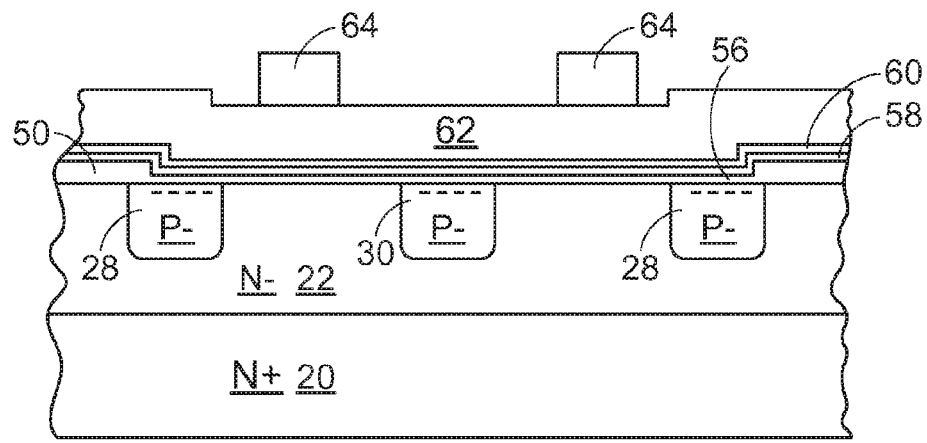
Figure 1H:
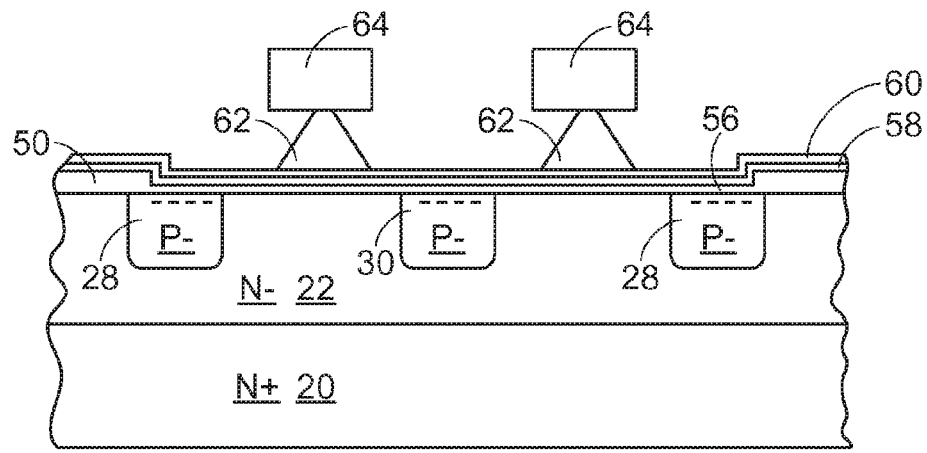
Figure 1I:
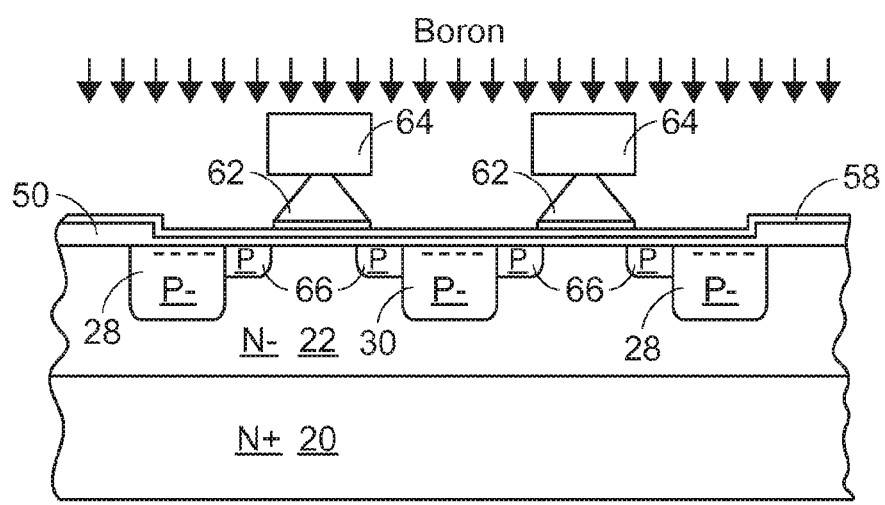
Figure 1J:
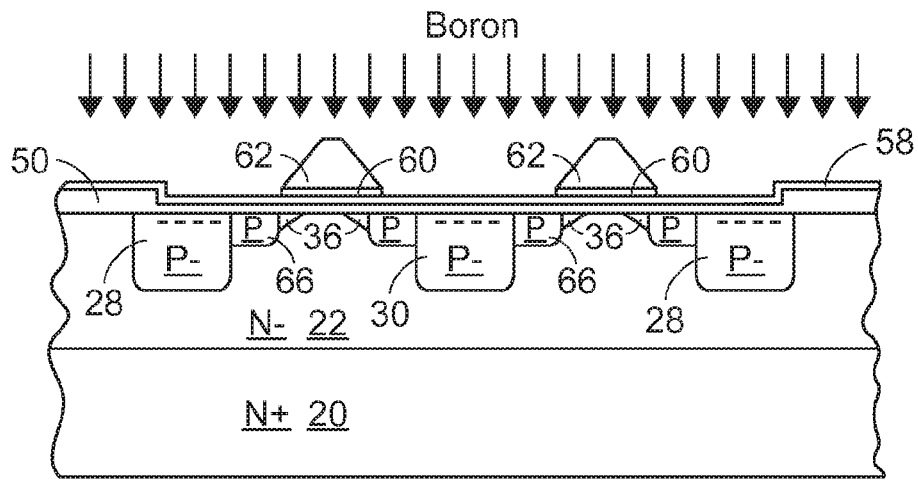
Figure 1K:
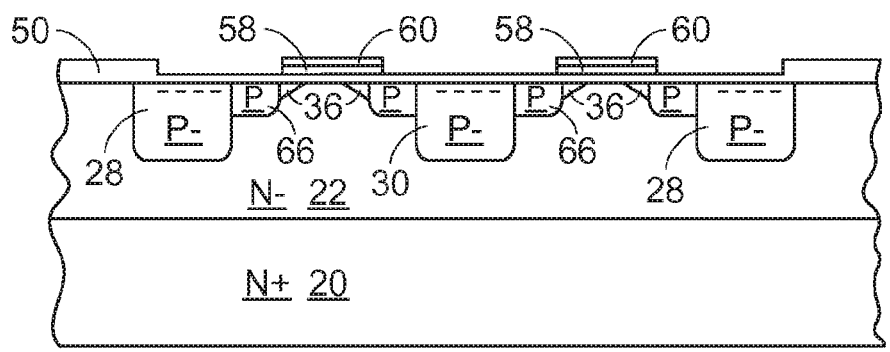
Figure 1L:
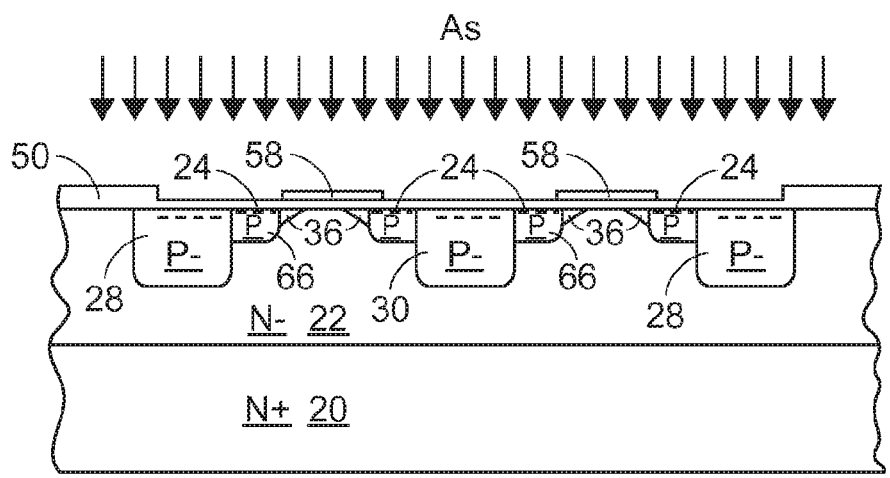
Figure 2A:
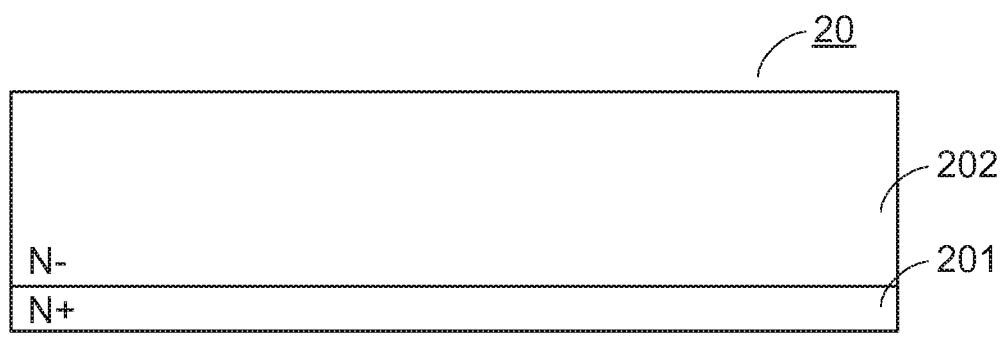
FIGS. 2A~2T schematically illustrate a method of manufacturing a low gate charging rectifier (Hunchback Diode) having a MOS structure and a P-N junction according to an embodiment of the present invention.
Figure 2B:
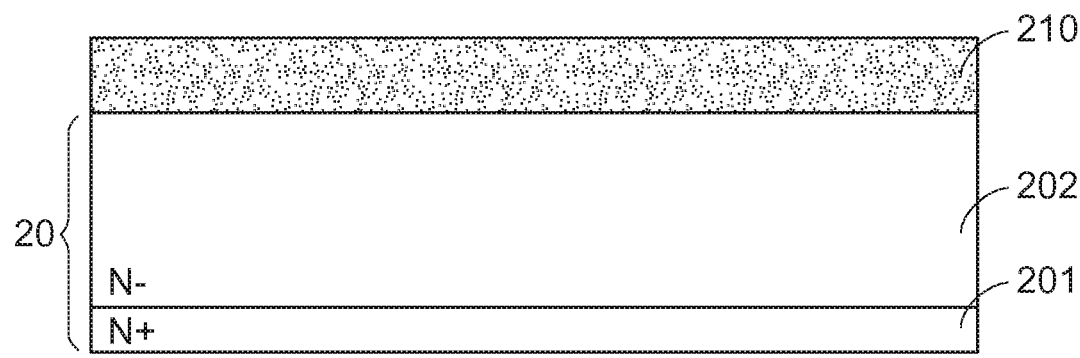
Figure 2C:
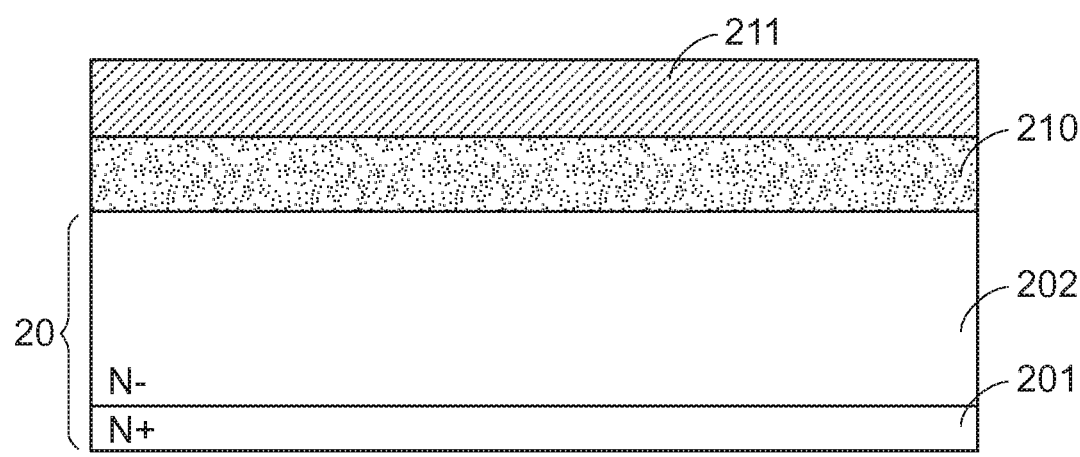
Figure 2D:
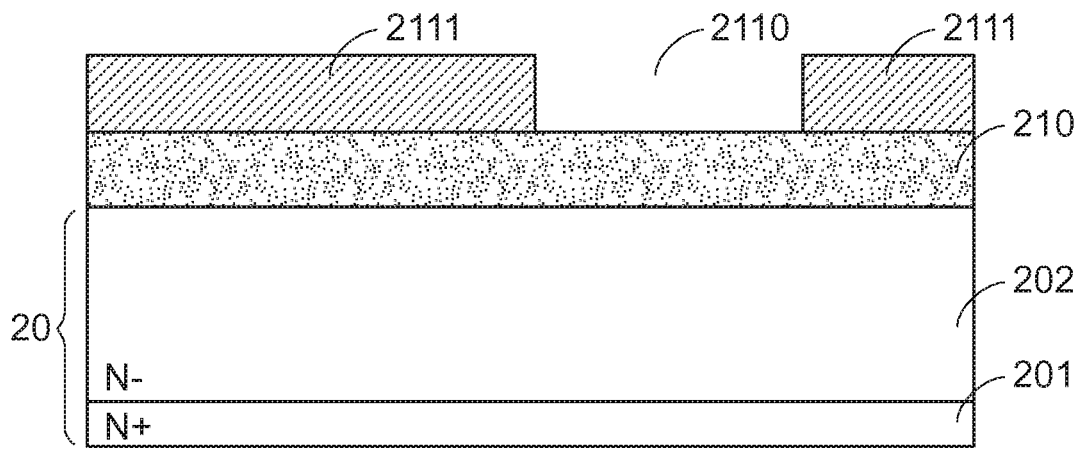
Figure 2E:
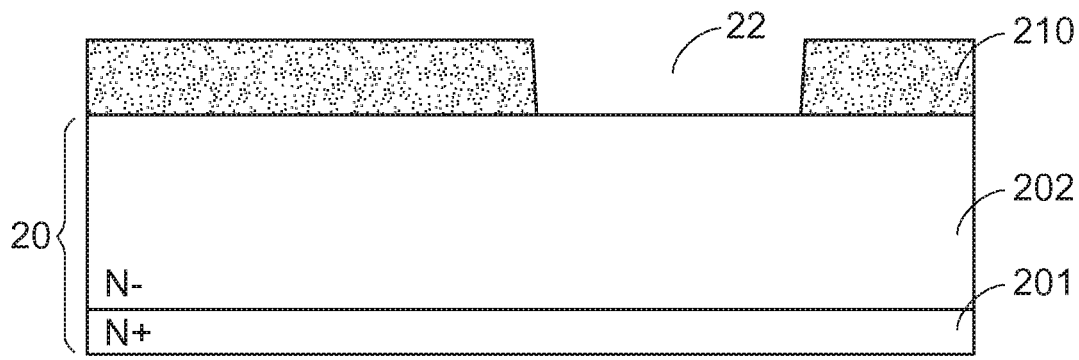
Figure 2F:
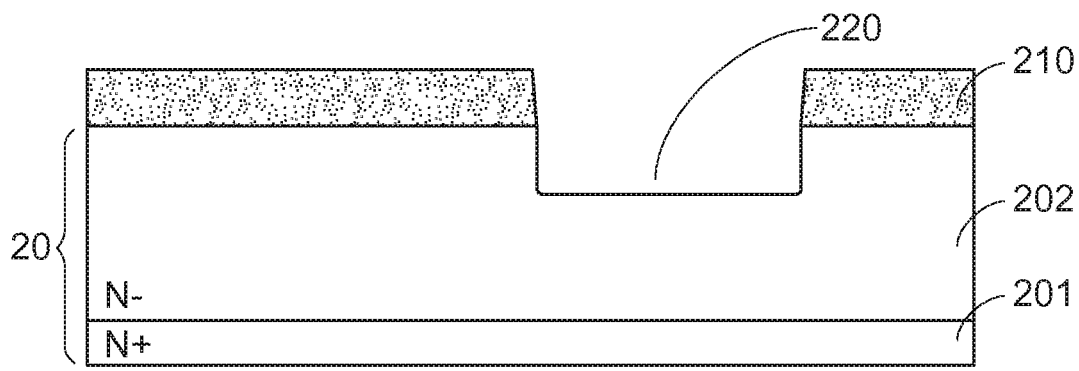
Figure 2G:
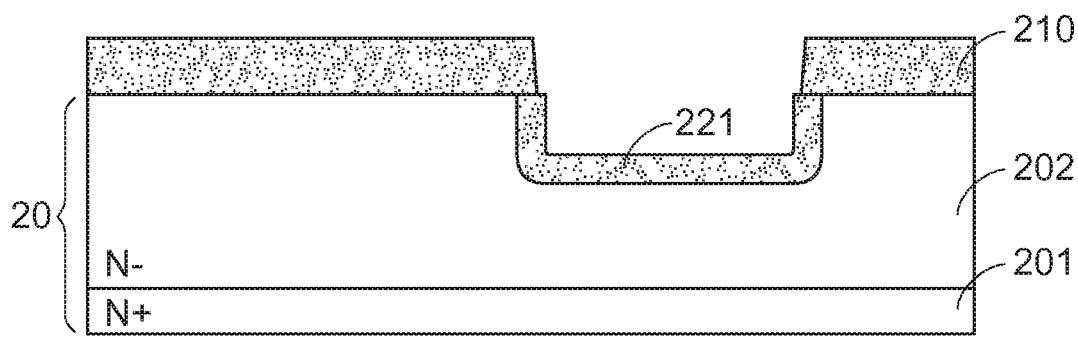
Figure 2H:
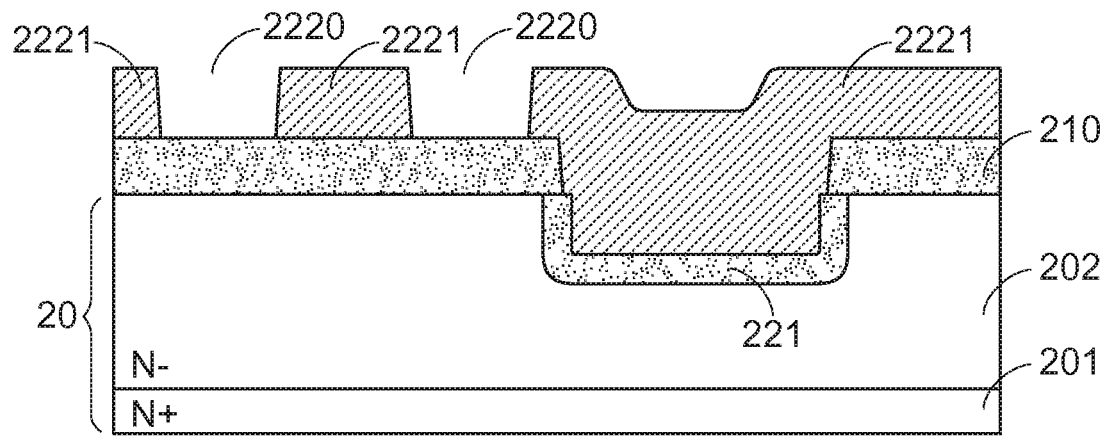
Figure 2I:
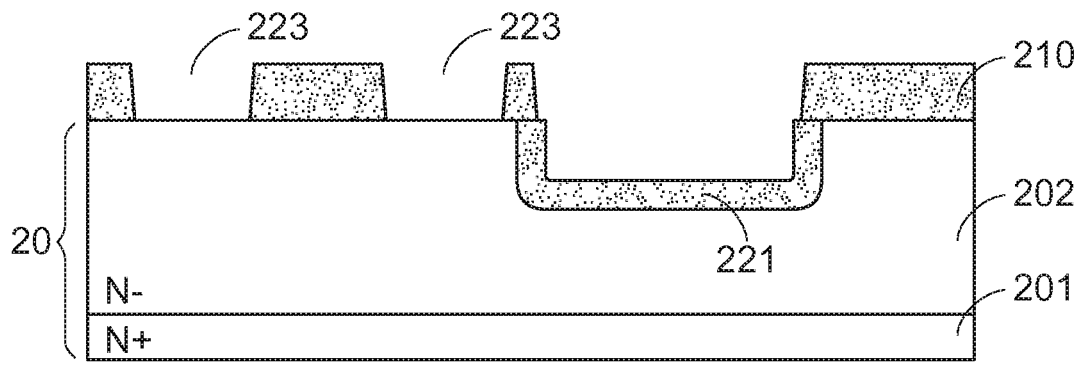
Figure 2J:
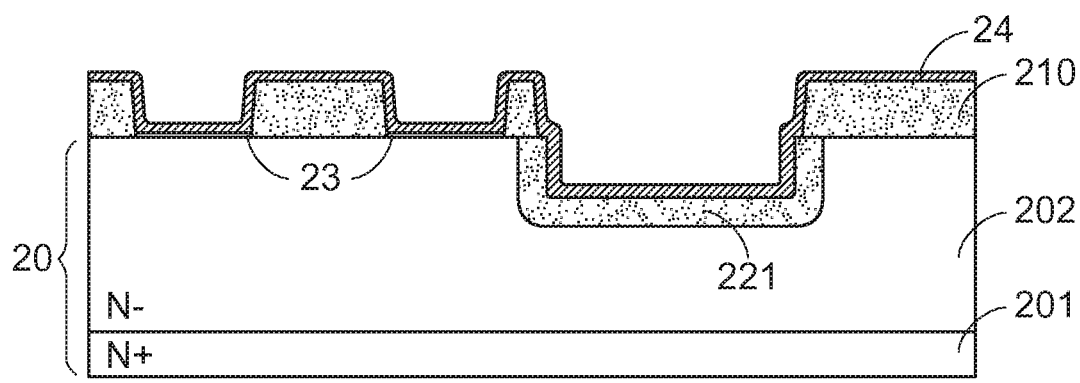
Figure 2K:
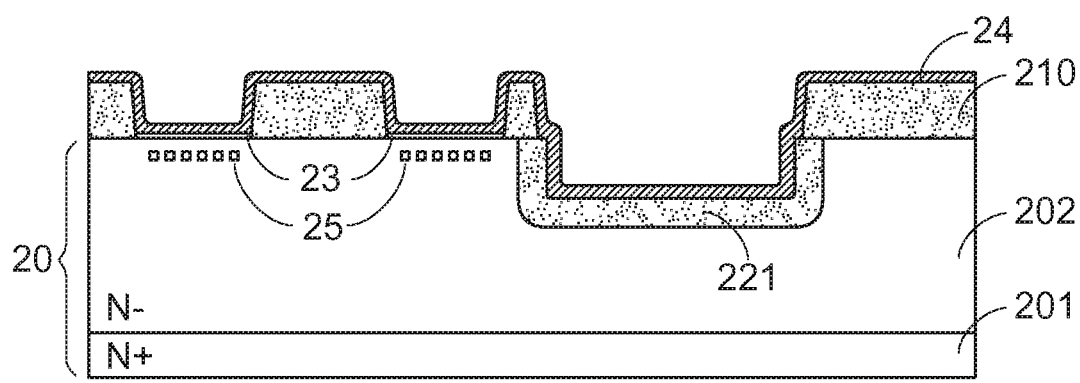
Figure 2L:
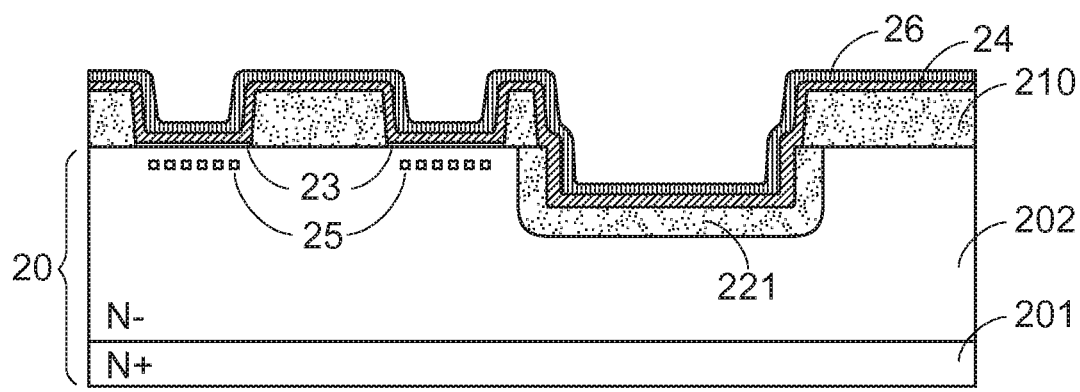
Figure 2M:
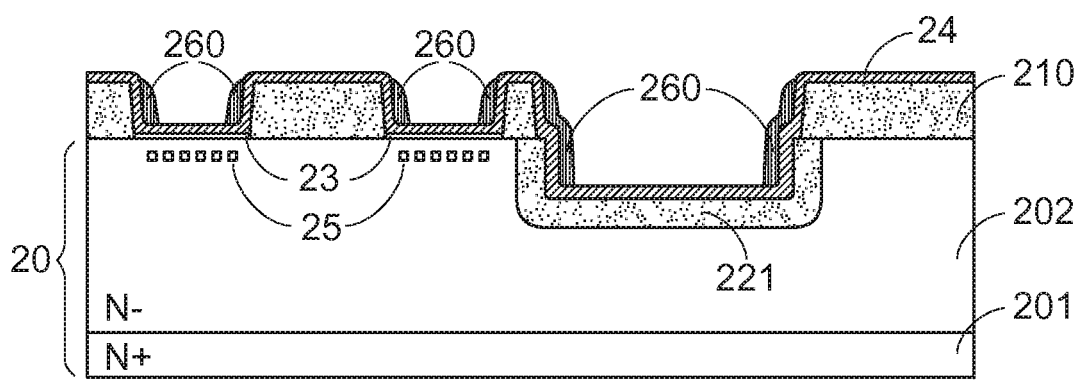
Figure 2N:
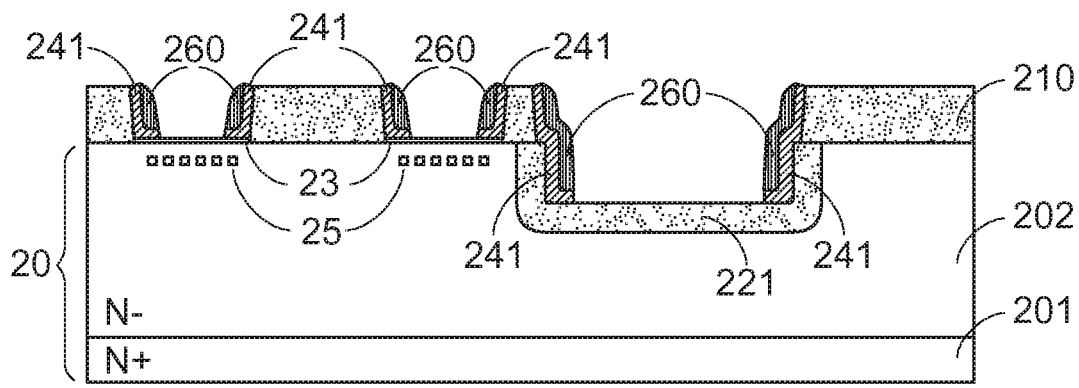
Figure 2O:
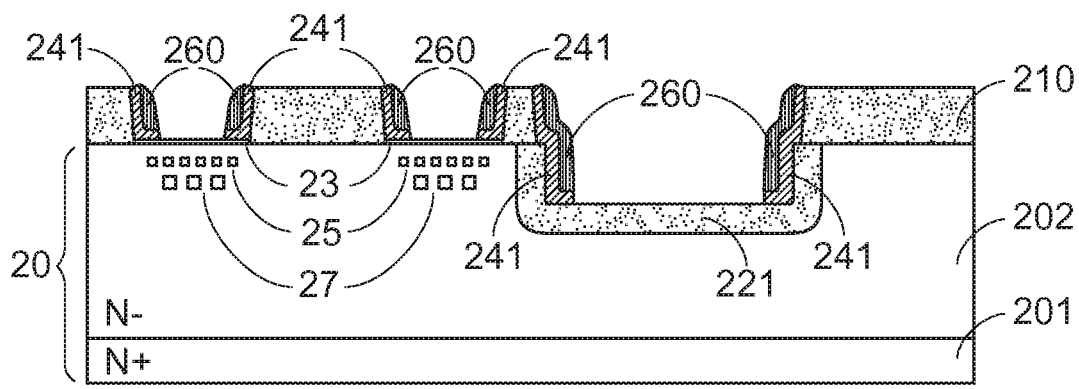
Figure 2P:
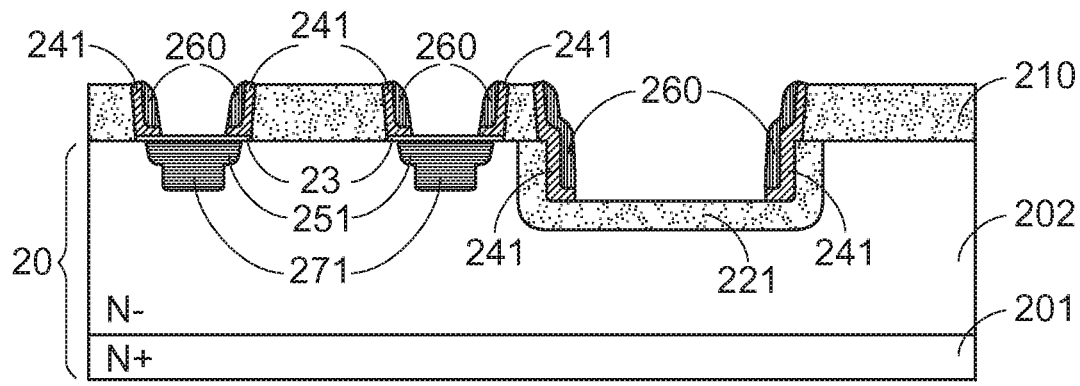
Figure 2Q:
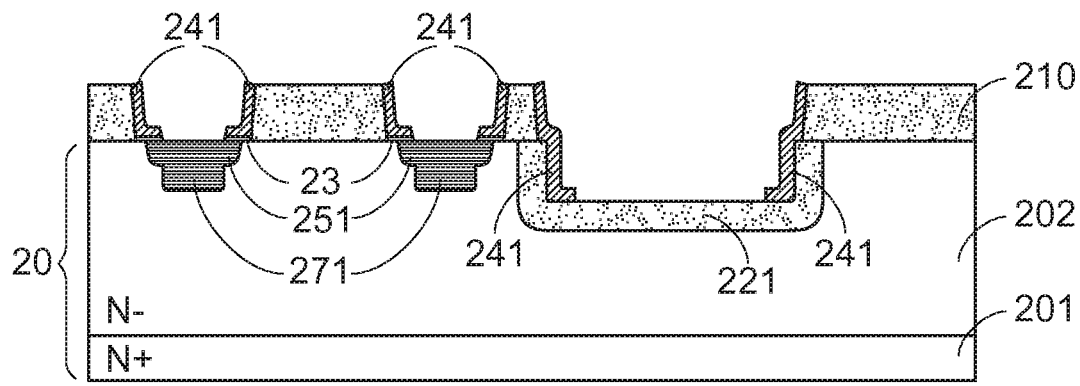
Figure 2R:
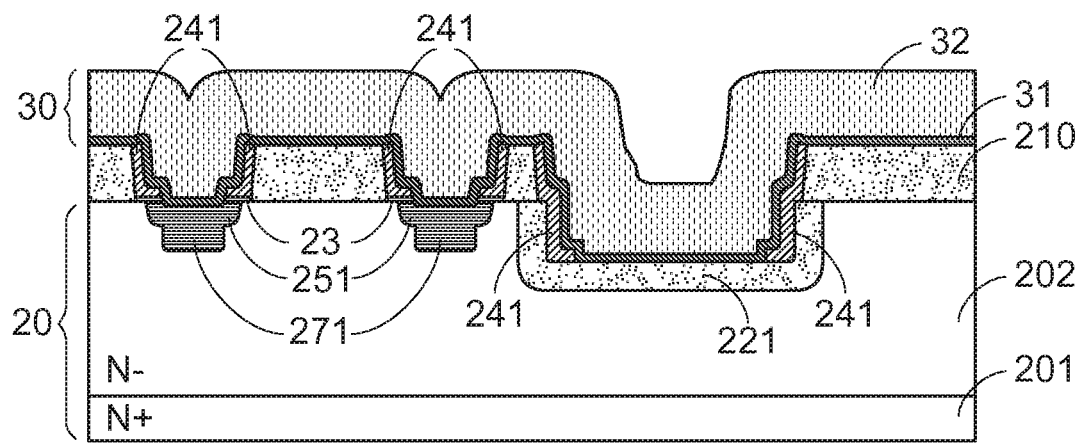
Figure 2S:
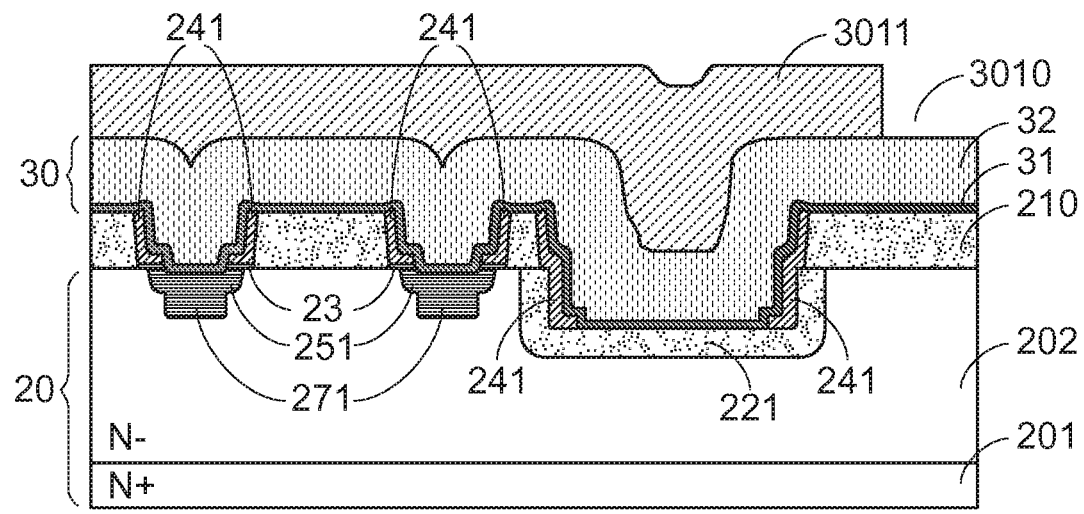
Figure 2T:
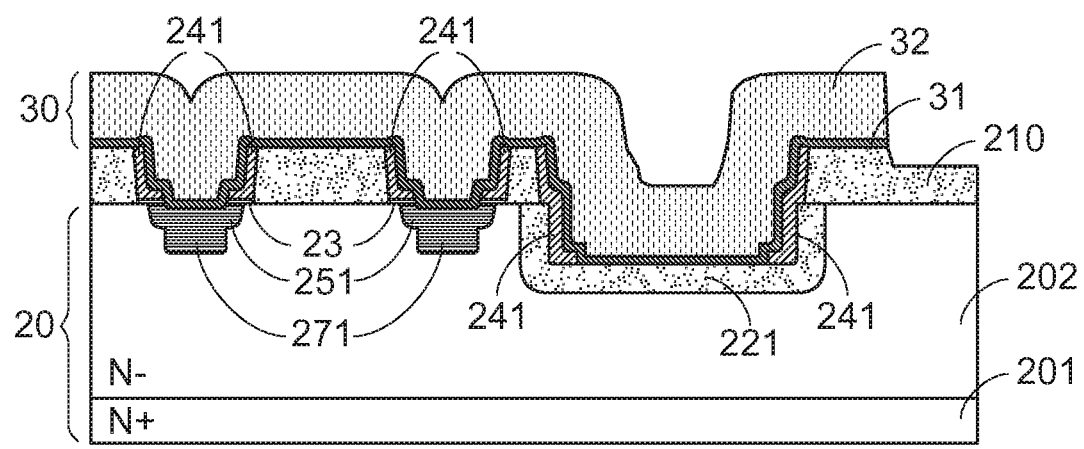

Please refer to FIGS. 2A~2T, which schematically illustrate a method of manufacturing a low gate charging rectifier having a MOS structure and a P-N junction according to an embodiment of the present invention.

Firstly, as shown in FIG. 2A, a substrate 20 with a heavily-doped N-type silicon layer 201 (N+ silicon layer) and a lightly-doped N-type epitaxial layer 202 (N– epitaxial layer) is provided. The lightly-doped N-type epitaxial layer 202 is formed on the heavily-doped N-type silicon layer 201. In addition, the thickness of the lightly-doped N-type epitaxial layer 202 is sufficient to provide subsequent structure.

Then, as shown in FIG. 2B, a first mask layer 210 is grown on the epitaxial layer 202 of the substrate 20. The first mask layer 210 is for example an oxide layer produced by thermal oxidation, an oxide layer produced by chemical vapor deposition, or a silicon nitride layer produced by chemical vapor deposition.

Then, a photoresist layer 211 is formed on the first mask layer 210 (FIG. 2C). A first photolithography process is performed to define a patterned photoresist zone 2111 and a photoresist-free zone 2110 of the photoresist layer 211 (FIG. 2D). An etching process is performed to remove the first mask layer 210 uncovered by the patterned photoresist zone 2111, and the remaining patterned photoresist zone 2111 is removed to form a first concave structure 22 in the first mask layer 210 (FIG. 2E).

Then, a dry etching process is performed to partially remove the epitaxial layer 202 uncovered by the remaining first mask layer 210 to form a first trench structure 220 in the epitaxial layer 202 (FIG. 2F). Then, as shown in FIG. 2G, a first oxide layer 221 is grown on an inner surface of the first trench structure 220.

A second photolithography process is performed to define a patterned photoresist zone 2221 and a photoresist-free zone 2220 over the first mask layer 210 and the first trench structure 220 (FIG. 2H). A dry etching process is performed to remove the first mask layer 210 uncovered by the patterned photoresist zone 2221. After the remaining patterned photoresist zone 2221 is removed, a second concave structure 223 is formed in the first mask layer 210 (FIG. 2I). Then, a gate oxide layer 23 is grown on a bottom of the second concave structure 223 (i.e. the top surface of the epitaxial layer 202), and a polysilicon gate layer 24 is formed on the gate oxide layer 23, the first mask layer 210 and the first oxide layer 221 (FIG. 2J).

Then, an ion-implanting process (e.g. a shallow ion-implanting process) is performed to dope the epitaxial layer 202 with a boron ion to form a first doped region 25 in the epitaxial layer 202 (FIG. 2K).

Then, as shown in FIG. 2L, a second mask layer 26 is formed over the polysilicon gate layer 24. The second mask layer 26 is for example a silicon nitride layer produced by chemical vapor deposition or an oxide layer produced by chemical vapor deposition. In this embodiment, the second mask layer 26 is a silicon nitride layer. Then, a dry etch-back process is performed to partially remove the third mask layer 26 to form a covering structure 260 on a sidewall of the polysilicon gate layer 24 within the second concave structure 223 and a sidewall of the polysilicon gate layer 24 within the first trench structure 260 (FIG. 2M).

Then, an etching process is performed to partially remove the polysilicon gate layer 24 to form an L-shaped gate structure 241 (FIG. 2N).

Then, an ion-implanting process (e.g. a deep ion-implanting process) is performed to dope the epitaxial layer 202 with a boron ion to form a second doped region 27 in the epitaxial layer 202 (FIG. 2O). Then, an annealing process (e.g. a rapid thermal annealing process) is performed to activate the first doped region 25 and the second doped region 27 to form effective P-type regions 251 and 271 (FIG. 2P).

Then, a wet etching process is performed to remove the silicon nitride covering structure 260, and the exposed gate oxide layer 23 is removed (FIG. 2Q). Then, a metallic sputtering process is performed to form a metallic sputtering layer 30 over the bottom and sidewall of the first trench structure 220, the bottom and sidewall of the second concave structure 223, the surface and sidewall of the polysilicon gate structure 241, the first mask layer 210 and the first oxide layer 221 (i.e. the exposed portion of the first oxide layer 221) (FIG. 2R). In this embodiment, the metallic sputtering layer 30 comprises a first metal layer 31 and a second metal layer 32. The first metal layer 31 is made of titanium or titanium nitride. The second metal layer 32 is made of aluminum or other metallic material (e.g. copper). Moreover, after the metallic sputtering layer 30 is formed, a rapid thermal nitridation process is performed to facilitate adhering the first metal layer onto the first trench structure 220, the second concave structure 223, the gate structure 241, the first mask layer 210 and the first oxide layer 221.

Then, a photoresist layer is formed on the metallic sputtering layer 30. A third photolithography process is performed to define a patterned photoresist zone 3011 and a photoresist-free zone 3010 of the photoresist layer (FIG. 2S). An etching process is performed to partially remove the metallic sputtering layer 30 uncovered by the patterned photoresist zone 3011. After the remaining patterned photoresist zone 3011 is removed, a low gate charging rectifier having a MOS structure and a P-N junction is produced (FIG. 2T).

From the above description, since the low gate charging rectifier of the present invention have a lower gate capacitance value when compared with the conventional gated diode device, the low gate charging rectifier has shorter reverse recovery time. Moreover, since the low gate charging rectifier has a reduced gate-covering area, the reverse leakage current is low. Since a thinner gate oxide layer may be used in the low gate charging rectifier, the forward voltage drop may be further reduced. As know, four mask layers and four photolithography processes are required in the method for manufacturing the conventional gated diode device. However, since three mask layers and three photolithography processes are used, the method for manufacturing the low gate charging rectifier (Hunchback Diode) of the present invention is simplified and more cost-effective. In other words, the present invention can obviate the drawbacks encountered from the prior art and has cost competitiveness.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a low gate charging rectifier having a metal-oxide-semiconductor (MOS) structure and a P-N junction, comprising steps of:
    providing a substrate;
    forming a first mask layer on the substrate;
    performing a first photolithography and etching process to partially remove the first mask layer to form a first concave structure in the first mask layer;
    performing a dry etching process to remove the substrate uncovered by the first mask layer to form a first trench structure in the substrate;
    performing an oxidation process to grow a first oxide layer on an inner surface of the first trench structure;
    performing a second photolithography and etching process to partially remove the first mask layer to form a second concave structure in the first mask layer;
    growing a gate oxide layer on a bottom of the second concave structure;
    forming a polysilicon layer on the gate oxide layer, the first mask layer and the first oxide layer;
    performing a first ion-implanting process to dope the substrate to form a first doped region;
    forming a second mask layer on the polysilicon layer;
    performing a dry etch-back process to partially remove the second mask layer to form a covering structure on a sidewall of the polysilicon layer within the second concave structure and on a sidewall of the polysilicon layer within the first trench structure;
    performing an etching process to partially remove the polysilicon layer to form a gate structure;
    performing a second ion-implanting process to dope the substrate to form a second doped region;

performing an annealing process to activate the first doped region and the second doped region to form an effective P-type region;

performing a wet etching process to remove the covering structure of the second mask layer;

removing an exposed portion of the gate oxide layer;

performing a metallic sputtering process to form a metallic sputtering layer on a bottom and a sidewall of the first trench structure, a bottom and a sidewall of the second concave structure, a surface and a sidewall of the gate structure, the first mask layer and the first oxide layer; and performing a third photolithography and etching process to partially remove the metallic sputtering layer.

2. The method as claimed in claim 1, wherein the first mask layer is an oxide layer produced by thermal oxidation, an oxide layer produced by chemical vapor deposition, or a silicon nitride layer produced by chemical vapor deposition.

3. The method as claimed in claim 1, wherein the first photolithography and etching process includes sub-steps of:
forming a photoresist layer on the first mask layer;
defining a patterned photoresist zone of the photoresist layer;
etching the first mask layer uncovered by the patterned photoresist zone to form the first concave structure;
removing the remaining photoresist layer; and
performing a dry etching process to partially remove the substrate uncovered by the remaining first mask layer to form the first trench structure.

4. The method as claimed in claim 1, wherein the substrate comprises a heavily-doped N-type silicon layer (N+ silicon layer) and a lightly-doped N-type epitaxial layer (N− epitaxial layer).

5. The method as claimed in claim 1, wherein the second photolithography and etching process includes sub-steps of:
forming a photoresist layer on the first mask layer;
defining a patterned photoresist zone of the photoresist layer;
etching the first mask layer uncovered by the patterned photoresist zone to form the second concave structure; and
removing the remaining photoresist layer.

6. The method as claimed in claim 1, wherein the second mask layer is a silicon nitride layer produced by chemical vapor deposition or an oxide layer produced by chemical vapor deposition.

7. The method as claimed in claim 1, wherein the first ion-implanting process is a shallow ion-implanting process to dope the substrate with boron ion, the second ion-implanting process is a deep ion-implanting process to dope the substrate with boron ion, and the first doped region and the second region are activated by a rapid thermal annealing process.

8. The method as claimed in claim 1, wherein the metallic sputtering layer comprises:
a first metal layer formed on the bottom and the sidewall of the first trench structure, the bottom and the sidewall of the second concave structure, the surface and the sidewall of the gate structure, the first mask layer and the first oxide layer, wherein the first metal layer is made of titanium or titanium nitride; and
a second metal layer formed on the first metal layer and made of aluminum,
wherein after the metallic sputtering layer is formed, a rapid thermal nitridation process is performed to facilitate adhering the first metal layer onto the first trench structure, the second concave structure, the gate structure, the first mask layer and the first oxide layer.

9. The method as claimed in claim 1, wherein the third photolithography and etching process includes sub-steps of:
forming a photoresist layer on the metallic sputtering layer;
defining a patterned photoresist zone of the photoresist layer;
etching the metallic sputtering layer uncovered by the patterned photoresist zone; and
removing the remaining photoresist layer.

10. A low gate charging rectifier having a metal-oxide-semiconductor (MOS) structure and a P-N junction, the low gate charging rectifier comprising:
a substrate;
a mask layer formed on the substrate, wherein a concave structure is formed in the mask layer and the substrate is exposed by the concave structure;
a gate oxide layer formed at a periphery of a bottom of the concave structure and contacted to the substrate;
a gate structure formed on and contacted to the gate oxide layer and a sidewall of the concave structure;
a metallic sputtering layer formed on the bottom of the concave structure and the gate structure and contacted to the substrate and the gate structure; and
plural doped regions formed in the substrate at different depths and arranged under the concave structure and contacted to the gate oxide layer and the metallic sputtering layer.

11. The low gate charging rectifier as claimed in claim 10, wherein the gate structure is a polysilicon L-shaped gate structure.

12. The low gate charging rectifier as claimed in claim 10, wherein the metallic sputtering layer comprises:
a first metal layer formed on the bottom of the concave structure and a surface and a sidewall of the gate structure, wherein the first metal layer is made of titanium or titanium nitride; and
a second metal layer formed on the first metal layer and made of aluminum or copper.

13. The low gate charging rectifier as claimed in claim 10, wherein plural doped regions comprises a shallow doped region and a deep doped region.

\* \* \* \* \*